US010175316B2

(12) United States Patent
Fath et al.

(10) Patent No.: US 10,175,316 B2
(45) Date of Patent: Jan. 8, 2019

(54) GRADIENT COIL ARRANGEMENT, MAGNETIC RESONANCE APPARATUS AND METHOD FOR DAMPING A GRADIENT COIL ARRANGEMENT

(71) Applicant: Siemens Aktiengesellschaft, Munich (DE)

(72) Inventors: Sascha Fath, Erlangen (DE); Marcel Rischke, Bubenreuth (DE); Markus Vester, Nuremberg (DE)

(73) Assignee: Siemans Aktiengesellschaft, Munich (DE)

( * ) Notice: Subject to any disclaimer, the term of this patent is extended or adjusted under 35 U.S.C. 154(b) by 399 days.

(21) Appl. No.: 15/016,946

(22) Filed: Feb. 5, 2016

(65) Prior Publication Data

US 2016/0231400 A1  Aug. 11, 2016

(30) Foreign Application Priority Data

Feb. 6, 2015 (DE) .................. 10 2015 202 165

(51) Int. Cl.
*G01R 33/385*  (2006.01)
*G01R 33/3875*  (2006.01)
*G01R 33/421*  (2006.01)

(52) U.S. Cl.
CPC ....... *G01R 33/385* (2013.01); *G01R 33/3875* (2013.01); *G01R 33/3858* (2013.01); *G01R 33/4215* (2013.01)

(58) Field of Classification Search
CPC .............. G01R 33/385; G01R 33/3875; G01R 33/4215; G01R 33/3858
See application file for complete search history.

(56) References Cited

U.S. PATENT DOCUMENTS

| 5,570,021 | A | * | 10/1996 | Dachniwskyj | ....... | G01R 33/385 324/318 |
| 5,680,086 | A | * | 10/1997 | Allis | .................. | G01R 33/383 324/318 |
| 6,028,476 | A | * | 2/2000 | Schweighofer | .... | G01R 33/3852 330/10 |
| 6,252,404 | B1 | * | 6/2001 | Purgill | ............. | G01R 33/34007 324/318 |
| 7,477,055 | B1 | * | 1/2009 | Huang | ............... | G01R 33/3815 324/318 |
| 2001/0048305 | A1 | * | 12/2001 | Borsi | ................. | G01R 31/1227 324/322 |
| 2002/0175684 | A1 | * | 11/2002 | Schaaf | ................. | G01R 33/385 324/318 |
| 2005/0148862 | A1 | * | 7/2005 | Sellers | ................ | G01R 33/385 600/422 |
| 2008/0084209 | A1 | * | 4/2008 | Seeber | ................ | G01R 33/385 324/318 |

(Continued)

*Primary Examiner* — G. M. A Hyder
(74) *Attorney, Agent, or Firm* — Schiff Hardin LLP

(57) ABSTRACT

Gradient coil arrangement for a magnetic resonance apparatus has multiple sub-coils formed by coil conductors on a common substrate, and the gradient coil arrangement has at least one damping producer that damps voltage overshoots occurring due to capacitive and/or inductive coupling between two sub-coils as a result of interfering frequencies in the wanted signal for at least one of the sub-coils affected. The damping producer is directly applied to the coil conductor of at least one of the sub-coils involved in the capacitive and/or inductive coupling.

15 Claims, 3 Drawing Sheets

(56) References Cited

U.S. PATENT DOCUMENTS

| | | | |
|---|---|---|---|
| 2010/0134108 A1* | 6/2010 | Fath | G01R 33/385 324/318 |
| 2010/0244837 A1* | 9/2010 | Seeber | G01R 33/3856 324/318 |
| 2012/0317795 A1 | 12/2012 | Fath et al. | |
| 2016/0128592 A1* | 5/2016 | Rosen | A61B 5/04012 600/411 |

* cited by examiner

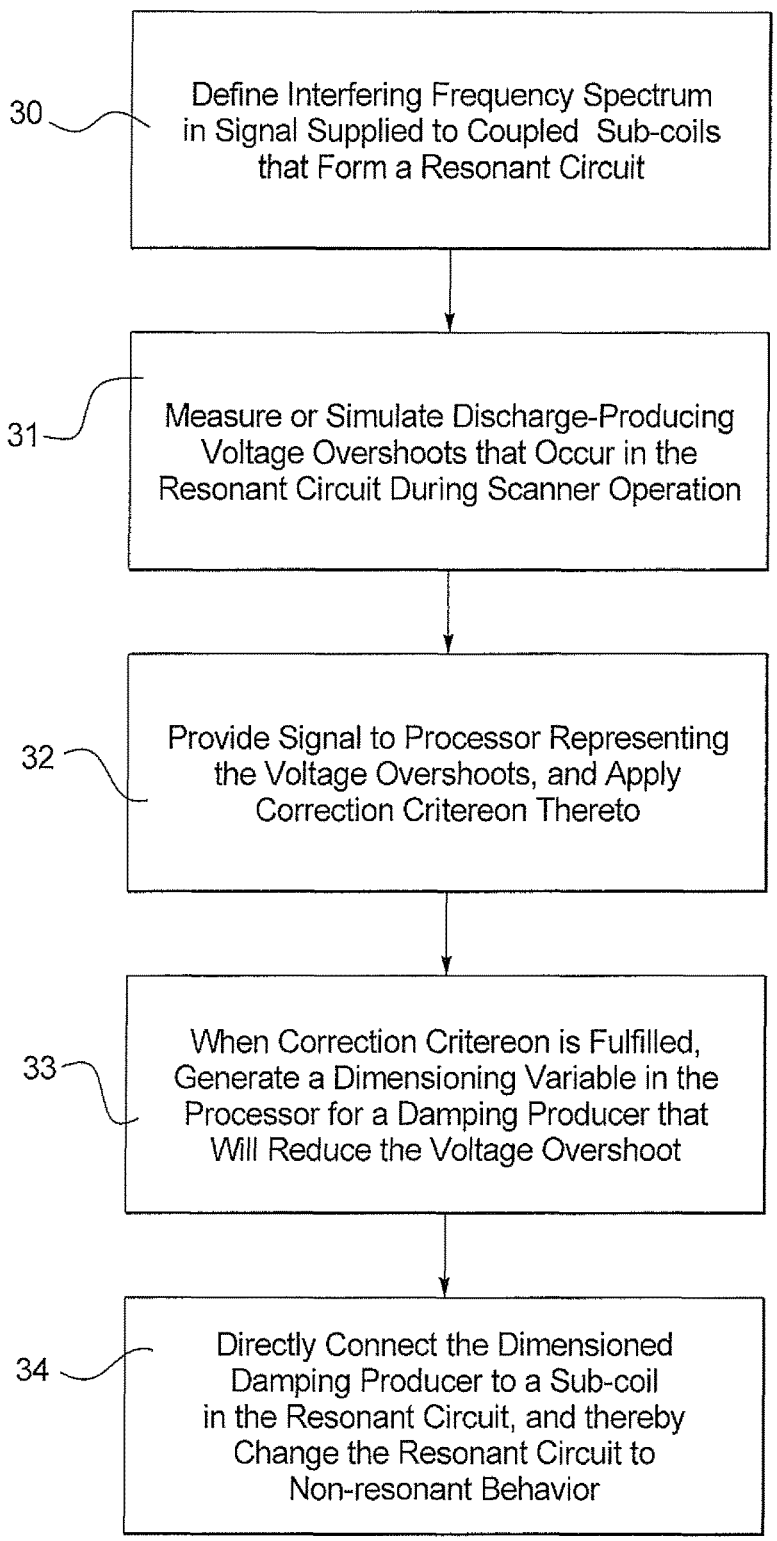

GRADIENT COIL ARRANGEMENT, MAGNETIC RESONANCE APPARATUS AND METHOD FOR DAMPING A GRADIENT COIL ARRANGEMENT

BACKGROUND OF THE INVENTION

Field of the Invention

The invention concerns a gradient coil arrangement for a magnetic resonance apparatus, composed of a number of sub-coils formed by coil conductors on a common substrate. The invention also concerns a magnetic resonance apparatus and a method for damping such a gradient coil arrangement in the scanner of a magnetic resonance apparatus.

Description of the Prior Art

Gradient coil arrangements of the above-described type are typically used in magnetic resonance apparatus, in the magnetic resonance scanner thereof, for encoding the magnetic resonance signals in different spatial directions. For this purpose, a number of sub-coils are disposed on a common substrate and sealed, e.g. in encapsulating material. The sub-coils are formed by a coil conductor, e.g. a copper wire of circular or oblong cross section, and/or implemented as conductor tracks. The sub-coils are supplied from a voltage source individually or as an interconnected group. The signals applied can be both DC voltages and voltages having other spectral components. Switching signals of a power amplifier having a clocked switching output stage may be present on one or more sub-coils. Moreover, these switching signals have a typical switching frequency on the order of 20 to 50 kHz, and exhibit corresponding harmonics that are technically relevant up to the 1 MHz range.

Because of the numerous sub-coils that form a primary and/or secondary layer of the gradient coils, and possibly a number of shim coils for adjusting the homogeneity of a $B_0$ field of the magnetic resonance scanner, and the spatially tight arrangement of their coil conductors, there is strong inductive and capacitive coupling between the sub-coils. This, together with the geometrically complex arrangement of the coil conductors, produces a resonance behavior involving natural frequencies that may coincide with the spectrum of the switching signal. If these natural frequencies are excited by the switching signal, locally large currents may be produced that heat the coil conductor unacceptably in this region. Additionally, the resulting electrical fields may exceed the breakdown field strength of the substrate material or inclusions present therein, thus producing spontaneous discharges. If a discharge or partial discharge has a power density in the reception band of the magnetic resonance apparatus, the discharge or partial discharge can severely impair imaging in the form of an artifact known as a spike. In extreme cases, even the insulation between the sub-coils can be damaged by such discharges.

To reduce these undesirable effects, it has been proposed to provide low-pass filters at the output of the switching output stage in order to suppress unwanted spectral components. A disadvantage of this approach is that such a low-pass filter also produces undesirable attenuation and phase shifts in its pass band. Moreover, such a filter is very complex/costly to implement because it must be designed to handle high currents and voltages (up to 1 kA and 2 kV respectively).

SUMMARY OF THE INVENTION

An object of the invention is to provide an improved gradient coil arrangement that reduces negative effects caused by the resonance behavior of the gradient coil arrangement.

This object is achieved in accordance with the invention by a gradient coil arrangement having a basic structure of the type described above, but wherein it is inventively provided that the gradient coil arrangement has at least one damping producer that damps voltage overshoots occurring due to capacitive and/or inductive coupling between two sub-coils because of interfering frequencies in the wanted signal for at least one of the sub-coils involved, and wherein the damping producer is mounted directly on the coil conductor of at least one of the sub-coils involved in the capacitive and/or inductive coupling.

The invention is based on the concept of locally damping voltage overshoots resulting from the resonance behavior of the gradient coil arrangement, i.e. damping them in their region of origin, by providing a damping producer such that the negative effects described above are prevented. It has been recognized that in the case of conventional gradient coil arrangements, which usually also contain shim coils, a manageable number of damping producer components selectively disposed at the points of origin of the resonances is enough to bring about a significant reduction in these effects. Thus the invention advantageously obviates the need for general damping by means of complex/costly low-pass filters, or rather the same damping effects can be achieved using a less complex/costly low-pass filter.

The location and composition of the at least one damping producer can be determined experimentally and/or as part of a method according to the invention.

It is particularly advantageous when at least two sub-coils jointly constitute a gradient coil and/or when a shim coil incorporated in the gradient coil arrangement is formed by at least one sub-coil. The above described switching signal is applied to a gradient coil, whereas shim coils used to reduce local magnetic field inhomogeneities are supplied with a DC voltage. Gradient coils have a primary layer and often a secondary layer used for shielding, each being composed of at least two sub-coils. By providing at least one damping producer, resonances between the sub-coils of the primary layer, the sub-coils of the secondary layer, one or more sub-coils of the primary layer and the secondary layer and between one or more sub-coils of different gradient coils, can therefore be damped. In addition, damping between one or more sub-coils of a gradient coil and the at least one sub-coil of a shim coil can be implemented. Thus the amount of resonance phenomena detected between the multiple of sub-coils of a gradient coil arrangement is advantageously dealt with individually and locally.

In the gradient coil arrangement according to the invention, the damping producer can be designed to reduce the Q-factor of a resonant circuit resulting from the capacitive and/or inductive coupling. Here it is particularly useful to lower the Q-factor of the respective resonant circuit such that its behavior becomes aperiodic and critical damping occurs. A resonant circuit overawing that produces voltage overshoots is then advantageously no longer possible.

The damping producer can be a resistance connected in parallel with at least one section of the coil conductor. The desired effect can be achieved here in a technologically simple manner. In particular, surface mount (SMD) resistors can be used whose resistance is in the range between 0.1 and 10 k$\Omega$.

Additionally or alternatively, the damping producer can be a wire running along at least one section of the coil conductor and having at least two cross-contacts with the coil conductor, the resistance per unit length of the wire being greater than that of the section of the coil conductor along which the wire runs. In this case, a parallel resistance that reduces the Q-factor of the resonant circuit is similarly implemented by providing an at least twice cross-contacted wire. The wire can be routed parallel to the coil conductor in its entirety, i.e. following its path, and/or can have regular cross-contacts therewith. The dimensioning of the wire is determined on the basis of its resistance per unit length in relation to the resistance per unit length of the coil conductor. In particular, wires made of metal alloys having relatively low electrical conductivity are suitable, such as chromium/nickel wires. A large number of suitable materials for the wire are known, so that a robust technological basis can be consulted.

Moreover, the damping producer can additionally or alternatively be a surface coating implemented along at least one section of the coil conductor and having a lower electrical conductivity than the section of coil conductor with which it is in contact. Within the scope of this further embodiment of the invention, the skin effect occurring in the case of radio-frequency signals is used to implement a damping producer that reduces the Q-factor of the resonant circuit. The thickness of the surface coating must be matched to the resonant frequency of the resonant circuit to be damped, because the skin effect is frequency-dependent. The surface coating can be made of similar materials to the wire described above, its thickness being preferably on the order of magnitude of the wire diameter. The damping effect of the damping producer thus can be achieved without the insertion of additional discrete components into the gradient coil arrangement. In addition, correspondingly coated coil conductors can be very simply incorporated in the gradient coil arrangement in an automated manner.

In another embodiment of the gradient coil arrangement according to the invention, the damping producer is additionally designed to shift the resonant frequency of a resonant circuit, resulting from capacitive and/or inductive coupling, out of an interference spectrum that includes the interfering frequencies. It is thus possible for the damping producer to influence the damping behavior of the resonant circuit independently of, or in addition to, reducing the Q-factor. The damping is achieved by the damping producer effecting a change in the resonant frequency of the resonant circuit so that the interfering frequencies are no longer resonant with the resonant circuit. Undesirable voltage overshoots are thus prevented. The damping is therefore achieved by detuning local resonant circuits. Multiple damping producers can be provided within the gradient coil arrangement, which can shift different resonant frequencies occurring therein.

It is preferred for the damping producer to have a capacitor connected in parallel with at least one section of the coil conductor. Since a large number of capacitors of different types and capacitances are available for selection, individual damping of voltage overshoots can be advantageously achieved. Here it is preferred to select discrete SMD capacitor components having capacitances of between 1 and 100 nF.

The invention also concerns a magnetic resonance apparatus having a gradient coil arrangement according to the invention.

In addition, the invention concerns a method for damping a gradient coil arrangement in a magnetic resonance apparatus, wherein the gradient coil arrangement has multiple sub-coils formed by coil conductors on a common substrate, with respect to voltage overshoots occurring due to capacitive and/or inductive coupling between two sub-coils because of interfering frequencies in the wanted signal for at least one of the sub-coils involved. In accordance with the inventive method, an interfering frequency spectrum of possible interfering frequencies is predefined. By measuring or simulating the operation of the gradient coil arrangement, voltage overshoots occurring in the case of the interfering frequencies between two sub-coils are determined. A correction criterion indicating the necessity for damping is applied to the voltage overshoots. For each voltage overshoot fulfilling the correction criterion, at least one voltage-overshoot-reducing dimensioning variable of a damping producer to be applied to at least one of the sub-coils affected by the voltage overshoot is determined and the damping producer is applied directly to the coil conductor of at least one of the sub-coils affected by the voltage overshoot. The interfering frequency spectrum is predefined on the basis of the fundamental frequency of the switching output stage and its harmonics. It can also be determined more precisely using measuring instrumentation.

In the context of the method according to the invention, it is also useful to use a network analyzer to measure the operation of the gradient coil arrangement. By the use of such devices that are known from the prior art, the resonance behavior of the gradient coil arrangement resulting in voltage overshoots can be precisely localized and the results of damping confirmed experimentally. For this purpose, the resonance behavior between two sub-coils is determined. They accordingly constitute the ports of the switches to be analyzed by the network analyzer. Alternatively or additionally, the operation of the gradient coil arrangement is carried out using simulation software. The geometry of the sub-coil must be modeled sufficiently precisely. Based on this, the resonance behavior between at least two sub-coils can be simulated, wherein, for example, voltages between sub-coils can again be selectively scanned.

In the method according to the invention, it is preferred to use exceeding a threshold value of a voltage overshoot as the correction criterion. The number of threshold value exceeding events that are ascertained determines the number of damping producer that are provided for damping the voltage overshoots. The more strictly the correction criterion is selected, the higher the number of damping measures to be taken. This threshold value is preferably set dependent on permissible temperature limit values of the coil conductor material, or limit values of the breakdown field strength for the substrate material. Also possible is a variant in which the threshold value (or in general the correction criterion) is selected such that a particular, limited number of damping producer can be employed.

To damp these voltage overshoots, it is preferred that a resistance of the damping producer is determined as a dimensioning variable. Similarly, it can also be advantageously provided that a capacitance of the damping producer is determined as a dimensioning variable. By using a resistance as a dimensioning variable, the Q-factor of the resonant circuit causing the voltage overshoots can be reduced to the extent that the correction criterion is fulfilled. It is particularly preferred that aperiodic damping is achieved. Using a capacitance as dimensioning variable causes the resonant circuit to be detuned. Said capacitance can be selected such that the resonant frequency is outside the interference spectrum, therefore the correction criterion is no longer fulfilled.

It should be noted that the determining and dimensioning of the necessary damping producer can even be incorporated into the general design process for the gradient coil arrangement. Once, as is generally known, the coil conductor geometry has been determined, the dimensioning portion of the method according to the inventions can begin immediately.

All types of gradient coil arrangements can be similarly converted to the inventive magnetic resonance apparatus and the inventive method for damping a gradient coil arrangement, so that the already mentioned advantages can also be achieved therewith.

BRIEF DESCRIPTION OF THE DRAWINGS

FIG. 7 is a flowchart of an embodiment of the method according to the invention.

DESCRIPTION OF THE PREFERRED EMBODIMENTS

Figure 1:
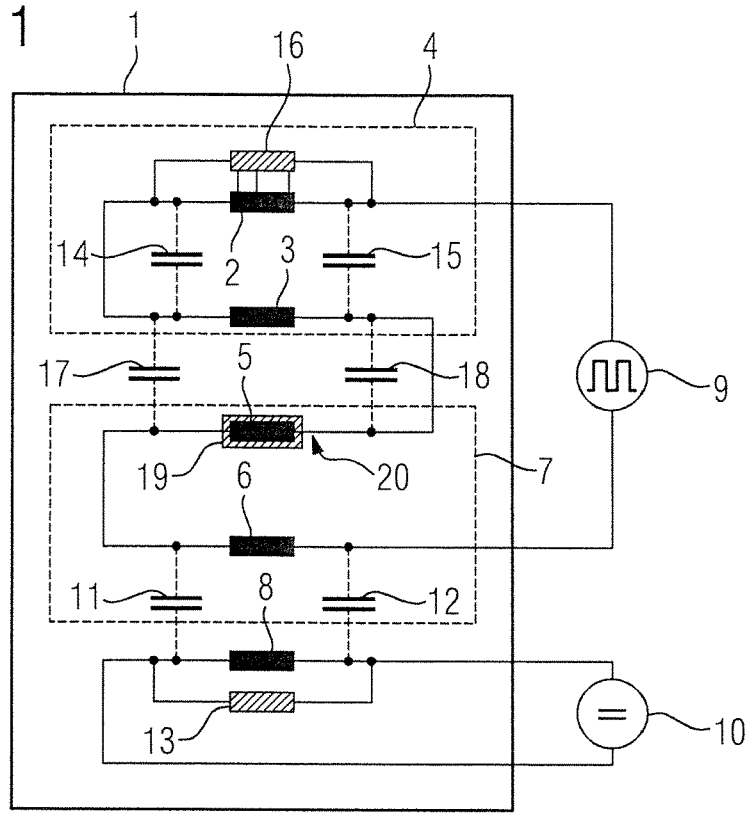
FIG. 1 is a block diagram of a gradient coil arrangement according to the invention.

FIG. 1 is a block diagram of a gradient coil arrangement 1, comprising a primary layer 4 having two sub-coils 2, 3, a secondary layer 7 having two sub-coils 5, 6 of a gradient coil, and a sub-coil 8 as a shim coil. The secondary layer 7 connected in series with the primary layer 4 is connected to the output of a power amplifier 9 with a clocked switching output stage which has a fundamental frequency of 20 kHz. The output signals of the power amplifier 9 therefore contain, in addition to a wanted signal, also interfering frequencies originating from the fundamental frequency of the switching output stage and its harmonics. The shim coil 8 is connected to a DC voltage source 10.

Because of capacitive coupling, symbolized by two capacitances 11, 12, between the sub-coils 6, 8, these form a resonant circuit which is damped by a first damping producer 13 such that interfering frequencies of the power amplifier 9 which are coupled into the sub-coil 8 can produce no resonance-induced voltage overshoots between the sub-coils 6, 8. The damping producer 13 is implemented using discrete resistors and capacitors.

There is also coupling, symbolized by the capacitances 14, 15, between the sub-coils 2, 3 of the secondary layer 4. Here too, voltage overshoots occur due to the resonant circuit constituted by the capacitances 14, 15 and the sub-coils 2, 3. These are damped by a second damping producer 16 which is implemented from a multiply cross-contacted wire.

Finally, there is additional capacitive coupling, symbolized by the capacitances 17, 18, between the primary layer 7 and the secondary layer 4, thereby producing once again a resonant circuit constituted by the capacitances 17, 18 and the sub-coils 3, 5. This is damped using a third damping producer 19 which is implemented as a surface coating on a coil conductor 20 of the sub-coil 5.

In the context of this exemplary embodiment it is pointed out that, for clearer explanation, three different implementations of the damping producer 13, 16, 19 in the gradient coil arrangement 1 are described. It is possible and in some circumstances also advantageous to provide a single type of implementation for all the damping producers within a gradient coil arrangement. In addition, the gradient coil arrangement will usually implement gradient coils for all three spatial directions x, y, z and at least one shim coil for the $B_0$ field (main magnetic field); however, it has been found that in most cases a small number of damping producer, e.g. 2 to 6, are sufficient. In addition to the capacitive interactions, inductive interactions between the sub-coils are conceivable and possibly relevant.

Figure 2:
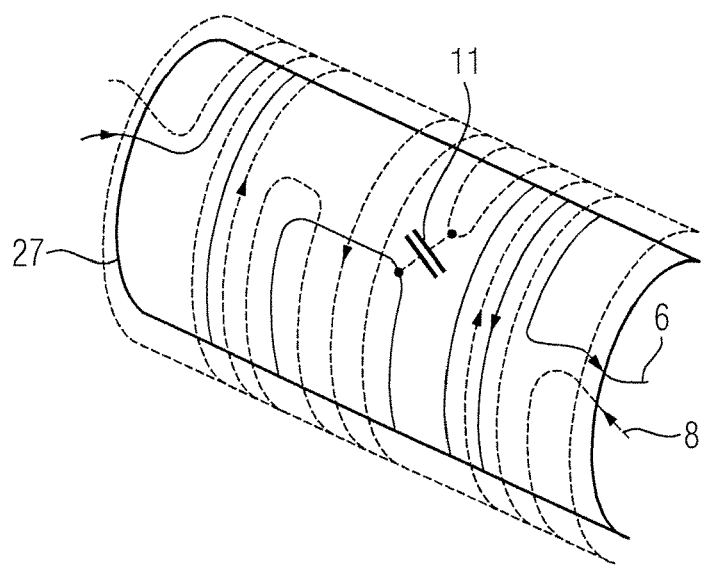
FIG. 2 shows a detail of a substrate having multiple sub-coils of the gradient coil arrangement.

FIG. 2 shows a detail of a substrate 27 of the gradient coil arrangement 1. Here only the sub-coils 6, 8 are shown for the sake of clarity. The capacitive coupling between the latter is schematically represented by the capacitance 11.

Figure 3:
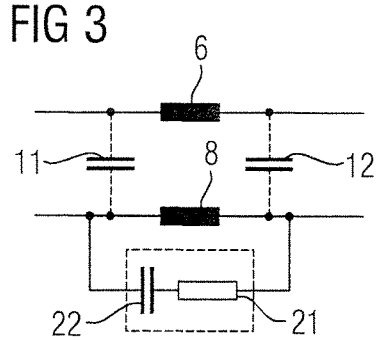
FIG. 3 is a circuit diagram of a damping producer implemented using discrete components.

FIG. 3 shows a schematic diagram of this capacitive coupling between the sub-coils 6, 8, wherein the resonant circuit produced in interaction with the capacitances 11, 12 is represented. The first damping element 13 comprises a resistor 21 and a capacitor 22 which are each implemented as SMD components and are connected in parallel with the sub-coil 8. The resistor 21 is dimensioned so as to reduce the Q-factor of the resonant circuit. In addition the capacitance of the capacitor 22 is selected such that the resonant frequency of the resonant circuit is outside coupled-in interfering frequencies of the power amplifier 9. This damps voltage overshoots that would otherwise be produced.

Figure 4:
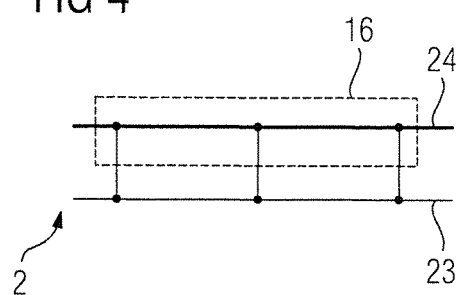
FIG. 4 shows a damping producer implemented as a wire.

FIG. 4 shows the second damping element 16 constituted by a wire 23. For this purpose a coil conductor 24 which forms the sub-coil 2 is shown, to which the wire 23 runs parallel and to which it is triply cross-contacted. The resistance per unit length of the wire 23 is here selected greater than that of the coil conductor 24 so that, once again, damping of the capacitive coupling (not shown in greater detail) is achieved. The wire 23 acts like a parallel-connected resistance so that voltage overshoots are damped by reducing the Q-factor of the resonant circuit.

Figure 5:
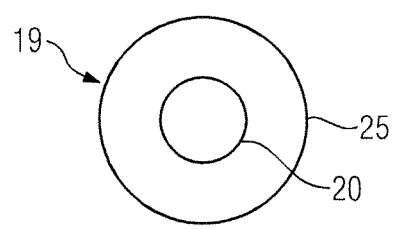
FIG. 5 is a cross-sectional view of a damping producer implemented as a surface coating.

FIG. 5 shows a cross-section through the coil conductor 20 and a surface coating 25 surrounding it which constitutes the third damping producer 19. The coil conductor 20 is here made of copper, whereas the surface coating 25 consists of a chromium-nickel alloy which has a much lower electrical conductivity than the coil conductor 20. The higher the frequency of the interference signal, the closer the signal passes to the surface of the arrangement comprising the coil conductor 20 and the surface coating 25. Accordingly, higher frequencies, particularly the harmonics of the switching signal, are mainly carried by the surface coating 25, so that, here too, a damping effect is applied to voltage overshoots that would otherwise be produced.

Figure 6:
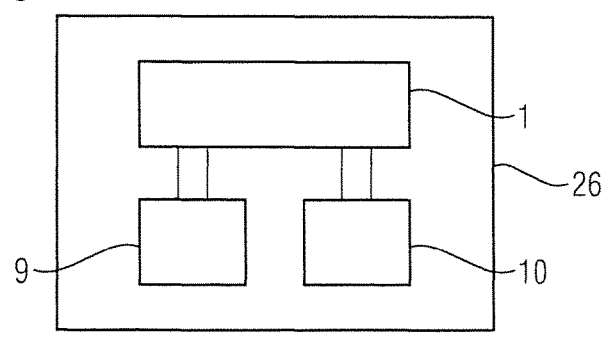
FIG. 6 is a schematic illustration of a magnetic resonance device according to the invention.

FIG. 6 is a schematic illustration of a magnetic resonance device 26, having the gradient coil arrangement 1 in the scanner of the apparatus, and the thereto connected power amplifier 9 and DC voltage source 10. The gradient coil arrangement 1 as described above ensures that voltage overshoots are effectively damped so that heating of coil conductors and/or partial discharges within the substrate that would otherwise be produced are prevented. This prevents damage to the gradient coil arrangement 1 and therefore also to the magnetic resonance device 26, as well as reducing the occurrence of radio-frequency spikes disturbing the reception of magnetic resonance signals.

In the method shown in FIG. 7 for damping a gradient coil arrangement 1, an interfering frequency spectrum of possible interfering frequencies is predefined in step 30. This can be determined by the fundamental frequency and the harmonics of a switching voltage source 9 or ascertained using measuring instrumentation.

In a next step 31, simulation of the operation of the gradient coil arrangement 1 in the event of the interfering frequencies is used to determine voltage overshoots occurring because of the resonant behavior resulting from capacitive and/or inductive coupling between two sub-coils 2, 3, 5, 6, 8 in each case.

In a subsequent step 32, a correction criterion consisting of a frequency-dependent threshold value of the voltage overshoots is applied to the measured voltage overshoots, wherein exceeding of this threshold value indicates that damping is necessary.

In a next step 33, for each voltage overshoot exceeding the threshold value, at least one dimensioning variable of a damping producer 13, 16, 19 to be applied to the sub-coil 2, 3, 5, 6, 8 in question is determined and the damping producer 13, 16, 19 is dimensioned according to the determined dimensioning variable or variables. For the first damping producer 13, a resistance value for a resistor 21 implemented as an SMD component and a thereto in series connected capacitance of a capacitor 22 likewise implemented in SMD technology is determined. Similarly, with respect to the second damping producer 16 a resistance per unit length of a wire 24 provided along a coil conductor 24 of the sub-coil 2 and having a number of cross-contacts is determined. The same procedure is used to determine the electrical conductivity of a surface coating 25 which constitutes the third damping producer 19. In particular, the frequency-dependent charge distribution as a result of the skin effect must be included in the simulation.

In a last step 34, the thus-dimensioned damping producer 13, 16, 19 is finally directly connected to at least one of the sub-coils 2, 5, 8 so as to change the resonant behavior to non-resonant behavior. This completes the method.

Although modifications and changes may be suggested by those skilled in the art, it is the intention of the inventors to embody within the patent warranted hereon all changes and modifications as reasonably and properly come within the scope of their contribution to the art.

We claim as our invention:

1. A gradient coil arrangement for a magnetic resonance (MR) apparatus, comprising:
   a plurality of sub-coils formed by coil conductors on a common substrate, said sub-coils each having a sub-coil input supplied with a switching signal that produces respective currents in the coils with interfering frequencies that produce coupling, selected from the group consisting of capacitive coupling and inductive coupling, between two of said sub-coils that causes said two of said sub-coils to form a resonant circuit, exhibiting a resonant behavior that creates voltage overshoots that cause discharges;
   at least one damping producer configured to damp said voltage overshoots that occur due to said resonant behavior; and
   said at least one damping producer being directly electronically connected to the coil conductor of at least one of the sub-coils in said resonant circuit, said at least one damping producer being dimensioned so as to change said resonant behavior to non-resonant behavior and thereby at least reduce said discharges.

2. A gradient coil arrangement as claimed in claim 1 wherein said sub-coils are configured on said substrate with at least two of said sub-coils forming a single gradient coil that produces one of said gradient fields oriented in one of said directions.

3. A gradient coil arrangement as claimed in claim 2 further comprising a shim sub-coil formed by a shim sub-coil conductor on said substrate provided with an input configured to receive a current for shimming a basic magnetic field.

4. A gradient coil arrangement as claimed in claim 1 wherein said damping producer is configured to reduce a Q-factor of a resonant circuit that results from said coupling.

5. A gradient coil arrangement as claimed in claim 4 wherein said damping producer comprises a resistor connected in parallel with at least one section of the coil conductor of a sub-coil.

6. A gradient coil arrangement as claimed in claim 4 wherein said damping producer comprises a wire proceeding along at least a section of a coil conductor of a sub-coil, and having at least two cross-contacts with said coil conductor, and having a resistance per unit length that is greater than a resistance per unit length of said section of said coil conductor along which said wire proceeds.

7. A gradient coil arrangement as claimed in claim 4 wherein said damping producer comprises at least one surface coating covering a section of a coil conductor of a sub-coil, and having a lower electrical conductivity than said section covered by said surface coating.

8. A gradient coil arrangement as claimed in claim 1 wherein said damping producer is configured to shift a resonant frequency of said resonant circuit that results from said coupling, out of an interference spectrum that encompasses said interfering frequencies.

9. A gradient coil arrangement as claimed in claim 8 wherein said damping producer comprises a capacitor connected in parallel with at least one section of a coil conductor of a sub-coil that forms said resonant circuit.

10. A magnetic resonance apparatus comprising:
    a magnetic resonance scanner;
    a plurality of sub-coils in said scanner formed by coil conductors on a common substrate, said sub-coils each having a sub-coil input supplied with a switching signal that produces respective currents in the coils with interfering frequencies that produce coupling, selected from the group consisting of capacitive coupling and inductive coupling, between two of said sub-coils that causes said two of said sub-coils to form a resonant circuit, exhibiting a resonant behavior that creates voltage overshoots that cause discharges;
    at least one damping producer configured to damp said voltage overshoots that occur due to said resonant behavior; and
    said at least one damping producer being directly electronically connected to the coil conductor of at least one of the sub-coils in said resonant circuit, said at least one damping producer being dimensioned so as to change said resonant behavior to non-resonant behavior and thereby at least reduce said discharges.

11. A method for damping a gradient coil arrangement of a magnetic resonance apparatus, said gradient coil arrangement comprising a plurality of sub-coils formed by coil conductors on a common substrate, so as to least reduce discharges in said gradient coil arrangement caused by voltage overshoots that occur due to coupling, selected from the group consisting of capacitive coupling and inductive coupling, between two of said sub-coils that causes said two of said sub-coils to form a resonant circuit, exhibiting a resonant behavior, as a result of interfering frequencies in a signal supplied to the conductor of at least one of said two sub-coils involved in said coupling, said method comprising:
    in a processor, defining an interfering frequency spectrum of possible interfering frequencies in said signal;

measuring or simulating said voltage overshoots that occur in said resonant circuit during operation of said gradient coil arrangement;

providing an electrical signal representing said voltage overshoots to said processor and applying a correction criterion to said voltage overshoots, said correction criterion designating that damping of said resonant circuit is necessary if said correction criterion is fulfilled;

for each voltage overshoot for which said correction criterion is fulfilled, generating, in said processor, at least one dimensioning variable of a damping producer to be directly electrically connected in said resonant circuit to at least one of the sub-coils that forms said resonant circuit, said at least one dimensioning variable being configured to reduce said voltage overshoot by changing said resonant behavior to non-resonant behavior and thereby at least reducing said discharges; and directly electrically connect said damping producer, dimensioned with said at least one dimensioning variable, in said resonant circuit to at least one of the sub-coils that forms said resonant circuit.

12. A method as claimed in claim 11 comprising measuring said voltage overshoot with a network analyzer connected to said gradient coil arrangement.

13. A method as claimed in claim 11 wherein said resonant circuit has a Q-factor, and comprising using, as said correction criterion, a threshold value of said Q-factor at which said resonant behavior begins.

14. A method as claimed in claim 11 comprising determining a resistance of said damping producer as said at least one dimensioning variable.

15. A method as claimed in claim 11 comprising determining a capacitance of said damping producer as said at least one dimensioning variable.

* * * * *